(12) United States Patent
Chen et al.

(10) Patent No.: US 10,872,898 B2
(45) Date of Patent: Dec. 22, 2020

(54) EMBEDDED NON-VOLATILE MEMORY DEVICE AND FABRICATION METHOD OF THE SAME

(71) Applicant: Cypress Semiconductor Corporation, San Jose, CA (US)

(72) Inventors: Chun Chen, San Jose, CA (US); James Pak, Sunnyvale, CA (US); Unsoon Kim, San Jose, CA (US); Inkuk Kang, San Jose, CA (US); Sung-Taeg Kang, Palo Alto, CA (US); Kuo Tung Chang, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/848,439

(22) Filed: Dec. 20, 2017

(65) Prior Publication Data
US 2019/0027484 A1    Jan. 24, 2019

Related U.S. Application Data

(60) Provisional application No. 62/534,512, filed on Jul. 19, 2017.

(51) Int. Cl.
*H01L 27/1157* (2017.01)
*H01L 27/11573* (2017.01)
(Continued)

(52) U.S. Cl.
CPC .... *H01L 27/1157* (2013.01); *H01L 27/11573* (2013.01); *H01L 29/42344* (2013.01);
(Continued)

(58) Field of Classification Search
CPC ......... H01L 27/11534; H01L 27/11573; H01L 29/66545; H01L 21/28282;
(Continued)

(56) References Cited

U.S. PATENT DOCUMENTS

| | | | |
|---|---|---|---|
| 8,524,557 B1 * | 9/2013 | Hall | H01L 29/66833 257/E21.662 |
| 8,642,457 B2 | 2/2014 | Fu et al. | |

(Continued)

FOREIGN PATENT DOCUMENTS

| | | |
|---|---|---|
| TW | 200924172 A | 6/2009 |
| TW | I390711 B | 3/2013 |

(Continued)

OTHER PUBLICATIONS

Wolf et al., Silicon Processing for the VLSI Era, vol. 1—Process Technology; Sunset Beach, CA: Lattice Press; 1986; pp. 555-557.*

(Continued)

*Primary Examiner* — Mary A Wilczewski (57) ABSTRACT

Systems and methods of forming such include method, forming a memory gate (MG) stack in a first region, forming a sacrificial polysilicon gate on a high-k dielectric in a second region, wherein the first and second regions are disposed in a single substrate. Then a select gate (SG) may be formed adjacent to the MG stack in the first region of the semiconductor substrate. The sacrificial polysilicon gate may be replaced with a metal gate to form a logic field effect transistor (FET) in the second region. The surfaces of the substrate in the first region and the second region are substantially co-planar.

25 Claims, 8 Drawing Sheets

(51) Int. Cl.
*H01L 29/423* (2006.01)
*H01L 29/66* (2006.01)

(52) U.S. Cl.
CPC ...... *H01L 29/665* (2013.01); *H01L 29/66515* (2013.01); *H01L 29/66545* (2013.01)

(58) Field of Classification Search
CPC ......... H01L 29/66606; H01L 29/66871; H01L 27/1157; H01L 29/42344; H01L 29/40117
See application file for complete search history.

(56) References Cited

U.S. PATENT DOCUMENTS

| | | | | |
|---|---|---|---|---|
| 8,871,598 | B1* | 10/2014 | Perera | H01L 29/665 257/E21.422 |
| 8,901,632 | B1* | 12/2014 | Perera | H01L 29/7831 257/314 |
| 8,956,941 | B2* | 2/2015 | Tsukuda | H01L 29/66833 438/287 |
| 9,082,650 | B2* | 7/2015 | Perera | H01L 21/28273 |
| 9,082,837 | B2* | 7/2015 | Perera | H01L 29/78 |
| 9,087,913 | B2* | 7/2015 | Hall | H01L 21/82 |
| 9,129,996 | B2 | 9/2015 | Baker et al. | |
| 9,136,129 | B2* | 9/2015 | Perera | H01L 21/28273 |
| 9,159,843 | B2* | 10/2015 | Saito | H01L 21/28282 |
| 9,275,864 | B2 | 3/2016 | Perera et al. | |
| 9,276,008 | B2 | 3/2016 | Cheek et al. | |
| 9,276,010 | B2 | 3/2016 | Chuang et al. | |
| 9,318,500 | B2* | 4/2016 | Shinohara | H01L 27/11568 |
| 9,318,568 | B2* | 4/2016 | Perera | H01L 29/42348 |
| 9,343,314 | B2* | 5/2016 | Loiko | H01L 21/28008 |
| 9,349,743 | B2* | 5/2016 | Nakanishi | H01L 27/11573 |
| 9,368,605 | B2 | 6/2016 | Lusetsky et al. | |
| 9,379,127 | B2* | 6/2016 | Toba | H01L 21/28282 |
| 9,425,206 | B2 | 8/2016 | Chuang et al. | |
| 9,431,413 | B2 | 8/2016 | Chuang et al. | |
| 9,496,276 | B2* | 11/2016 | Chuang | H01L 27/11573 |
| 9,508,837 | B2* | 11/2016 | Arigane | H01L 27/11568 |
| 9,515,082 | B2* | 12/2016 | Arigane | H01L 27/11568 |
| 9,543,153 | B2 | 1/2017 | Chuang et al. | |
| 9,543,314 | B2* | 1/2017 | Mihara | H01L 27/1157 |
| 9,570,539 | B2 | 2/2017 | Chuang et al. | |
| 9,583,591 | B2 | 2/2017 | Chuang et al. | |
| 9,583,641 | B1* | 2/2017 | Chang | H01L 29/7923 |
| 9,589,976 | B2 | 3/2017 | Tseng et al. | |
| 9,620,372 | B2 | 4/2017 | Liu et al. | |
| 9,659,948 | B2 | 5/2017 | Hsu et al. | |
| 9,659,953 | B2 | 5/2017 | Chuang et al. | |
| 9,704,875 | B2* | 7/2017 | Yamaguchi | H01L 21/31053 |
| 9,735,245 | B2 | 8/2017 | Chuang et al. | |
| 9,741,728 | B2 | 8/2017 | Chuang et al. | |
| 9,761,680 | B2 | 9/2017 | Li et al. | |
| 9,812,460 | B1* | 11/2017 | Wu | H01L 27/11521 |
| 9,825,050 | B2* | 11/2017 | Ogata | H01L 27/11568 |
| 9,831,318 | B2* | 11/2017 | Tokita | H01L 27/11568 |
| 10,014,410 | B2* | 7/2018 | Yamaguchi | H01L 27/115 |
| 10,128,259 | B1* | 11/2018 | Yang | H01L 27/11568 |
| 10,332,884 | B2* | 6/2019 | Yi | H01L 27/0924 |
| 2004/0188753 | A1* | 9/2004 | Kawashima | H01L 21/28273 257/316 |
| 2006/0044873 | A1* | 3/2006 | Katayama | G11C 16/0466 365/185.18 |
| 2008/0029805 | A1* | 2/2008 | Shimamoto | H01L 21/28282 257/315 |
| 2008/0185635 | A1* | 8/2008 | Yanagi | G11C 16/0466 257/325 |
| 2011/0095348 | A1* | 4/2011 | Chakihara | H01L 21/28273 257/298 |
| 2012/0104483 | A1* | 5/2012 | Shroff | H01L 21/28273 257/324 |
| 2012/0132978 | A1* | 5/2012 | Toba | H01L 21/28282 257/316 |
| 2012/0142153 | A1* | 6/2012 | Jeong | G11C 16/0425 438/264 |
| 2012/0299084 | A1* | 11/2012 | Saito | H01L 21/28282 257/324 |
| 2013/0084684 | A1* | 4/2013 | Ishii | H01L 21/28282 438/257 |
| 2013/0264634 | A1* | 10/2013 | Hall | H01L 27/04 257/326 |
| 2013/0267074 | A1* | 10/2013 | Hall | H01L 21/82 438/299 |
| 2014/0035027 | A1* | 2/2014 | Chakihara | G11C 16/0466 257/326 |
| 2014/0065776 | A1* | 3/2014 | Mihara | G11C 11/5671 438/239 |
| 2014/0120713 | A1* | 5/2014 | Shroff | H01L 21/28273 438/593 |
| 2014/0213030 | A1* | 7/2014 | Tsukuda | H01L 29/66833 438/287 |
| 2014/0227839 | A1* | 8/2014 | Shinohara | H01L 29/42344 438/261 |
| 2014/0227843 | A1* | 8/2014 | Tsukamoto | H01L 29/66507 438/275 |
| 2015/0035040 | A1* | 2/2015 | Yoo | H01L 29/7881 257/320 |
| 2015/0041875 | A1* | 2/2015 | Perera | H01L 29/78 257/314 |
| 2015/0054044 | A1* | 2/2015 | Perera | H01L 21/28273 257/314 |
| 2015/0093864 | A1* | 4/2015 | Perera | H01L 21/28273 438/257 |
| 2015/0145023 | A1* | 5/2015 | Arigane | H01L 27/11568 257/326 |
| 2015/0279853 | A1* | 10/2015 | Hall | H01L 29/42332 438/591 |
| 2015/0279854 | A1* | 10/2015 | Hall | H01L 29/66545 438/591 |
| 2015/0287736 | A1* | 10/2015 | Toba | H01L 21/28282 257/324 |
| 2015/0348786 | A1* | 12/2015 | Loiko | H01L 21/28008 257/316 |
| 2016/0013197 | A1* | 1/2016 | Liu | H01L 27/1157 257/322 |
| 2016/0013198 | A1* | 1/2016 | Liu | H01L 29/66833 257/322 |
| 2016/0035734 | A1* | 2/2016 | Kawashima | H01L 27/11529 438/258 |
| 2016/0043098 | A1* | 2/2016 | Nakanishi | H01L 27/11573 438/283 |
| 2016/0064389 | A1* | 3/2016 | Mihara | H01L 27/1157 257/314 |
| 2016/0064507 | A1* | 3/2016 | Amo | H01L 29/4975 257/314 |
| 2016/0087058 | A1* | 3/2016 | Perera | H01L 29/4966 257/314 |
| 2016/0099358 | A1* | 4/2016 | Kawashima | H01L 27/11573 438/287 |
| 2016/0141396 | A1* | 5/2016 | Arigane | H01L 27/11568 438/591 |
| 2016/0155747 | A1* | 6/2016 | Mihara | H01L 29/792 257/316 |
| 2016/0190144 | A1* | 6/2016 | Shinohara | H01L 29/42344 438/287 |
| 2016/0218108 | A1* | 7/2016 | Tokita | H01L 27/11568 |
| 2017/0069648 | A1* | 3/2017 | Yamaguchi | H01L 21/31053 |
| 2017/0133394 | A1* | 5/2017 | Ogata | H01L 21/1526 |
| 2017/0271162 | A1* | 9/2017 | Ogata | H01L 21/28282 |
| 2017/0278856 | A1* | 9/2017 | Yamaguchi | H01L 29/78 |
| 2017/0345841 | A1* | 11/2017 | Wu | H01L 29/66545 |
| 2018/0012898 | A1* | 1/2018 | Wu | H01L 29/7883 |
| 2018/0047746 | A1* | 2/2018 | Shinohara | H01L 27/11568 |
| 2018/0061849 | A1* | 3/2018 | Yamaguchi | H01L 29/66545 |
| 2018/0090508 | A1* | 3/2018 | Ogata | H01L 27/11568 |
| 2018/0138317 | A1* | 5/2018 | Lin | H01L 29/66833 |
| 2018/0211965 | A1* | 7/2018 | Yoshida | H01L 27/10 |

(56) References Cited

U.S. PATENT DOCUMENTS

2018/0342529 A1* 11/2018 Chuang ............. H01L 29/66545
2019/0131302 A1* 5/2019 Yi ..................... H01L 27/11573

FOREIGN PATENT DOCUMENTS

| TW | 201535687 A | 9/2015 |
| TW | I540708 B | 7/2016 |
| TW | 201701414 A | 1/2017 |
| TW | 201709425 A | 3/2017 |
| TW | 201719819 A | 6/2017 |
| TW | 201719867 A | 6/2017 |

OTHER PUBLICATIONS

International Search Report for International Application No. PCT/US18/42088 dated Aug. 9, 2018; 3 pages.
Wolf et al., "Silicon Processing for the VLSI Era," vol. 1: Process Technology, Lattice Press, 1986, pp. 555-557; 2 pages.
Written Opinion of the International Searching Authority for International Application No. PCT/US18/42088 dated Aug. 9, 2018; 8 pages.
TiPO Office Action for Application No. 107124509 dated Sep. 21, 2020; 5 pages.

* cited by examiner

EMBEDDED NON-VOLATILE MEMORY DEVICE AND FABRICATION METHOD OF THE SAME

CROSS-REFERENCE TO RELATED APPLICATIONS

This application claims the benefit of U.S. Provisional Application No. 62/534,512 filed on Jul. 19, 2017, the entire contents of which are hereby incorporated by reference.

BACKGROUND

Non-volatile memory (NVM) cells, such as flash memory cells, store data in computer memory systems. NVM cells may be formed on semiconductor substrates and include a number of transistors to provide memory functions and logic functions.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A split-gate non-volatile memory (NVM) cell can include a memory gate and a select gate formed on a semiconductor substrate. The split-gate configuration may provide improved size and efficiency characteristics compared to one transistor or two transistor NVM cell configurations. A split-gate memory cell may include a select gate to enable access to data stored in the memory cell and a memory gate that stores the data. In some implementations, the select gate and memory gate may be separated on a semiconductor substrate by one or more inter-gate dielectric layers.

While split-gate memory cells may provide some advantages in certain devices, integrating split-gate memory cells on a semiconductor substrate with certain logic devices may cause difficulties in fabrication. For example, certain advanced logic processes may use a high dielectric constant (high-k) gate dielectric with a metal gate (HKMG) to improve transistor performance and reduce leakage current. Some example high-k materials may include Hafnium Dioxide, Zirconium Dioxide, Titanium Dioxide, or the like. In some implementations, the high-K material may be characterized as having a dielectric constant greater than 2, 3, 3.5, or another value to provide proper functioning of the gate while reducing leakage currents. The HKMG may be fabricated using high-k dielectric material instead of a silicon based gate dielectric, such as silicon dioxide. In some implementations, however, fabrication of HKMG logic gates on the same substrate as a split-gate memory cell may cause shifts in the properties of the logic transistor. Additionally, differences in heights of a split-gate memory cell and a logic transistor may prevent proper fabrication of the memory cell or logic transistors during certain processing steps.

Disclosed herein are semiconductor devices and processes to integrate a split-gate NVM cell with a HKMG. The embedded devices may include a semiconductor substrate, such as Silicon, in a memory cell region of the substrate that is about the same height as the semiconductor substrate in a logic region of the device. For example, the substrate height in the different regions may be within approximately 200 angstroms of one another. The embedded device may also include upper surfaces of memory gates and select gates in the split-gate memory cell that are substantially co-planar. For example, the upper surface of the select gate and memory gate may be within approximately 300 angstroms of one another. Similarly, the upper surfaces of the select gate and memory gate may also be substantially co-planar with the upper surface of the HKMG logic transistor. This may reduce interference during logic gate replacement portions of a fabrication process. In some implementations, a silicide may also be formed on portions of the select gate or memory gate of a split-gate memory cell while silicide is not formed on a dielectric that separates the select gate and the memory gate.

Processes for fabricating a split-gate NVM cell embedded with an HKMG logic transistor may include fabricating the split-gate memory cell in a first region of a semiconductor substrate and a field-effect transistor (FET) with a high-k metal gate in a second region of the semiconductor substrate. Forming the split-gate memory cell may include forming a select gate (SG) and a memory gate (MG) adjacent to the select gate. In some implementations, the SG and MG may be separated by one or more layers of a dielectric. The logic FET may be formed on the same semiconductor substrate with a polysilicon gate, which may then be replaced with a metal gate. The high-k metal gate (HKMG) FET and the split-gate NVM memory cell may thus be formed on a semiconductor substrate having a substantially coplanar upper surface. Accordingly, in some embodiments, the semiconductor substrate may be substantially of similar thickness in both regions. For example, the SG, MG, and FET may be formed without creating a cavity or a recess in the substrate prior to deposition of elements of the gates. Furthermore, the heights of the SG, MG, and FET may be configured such that top surfaces of each of the SG, MG, and FET are substantially co-planar. Additional details of processing to fabricate the embedded split-gate memory device with a high-K metal gate FET are described in details with reference to the Figures below.

Figure 1:
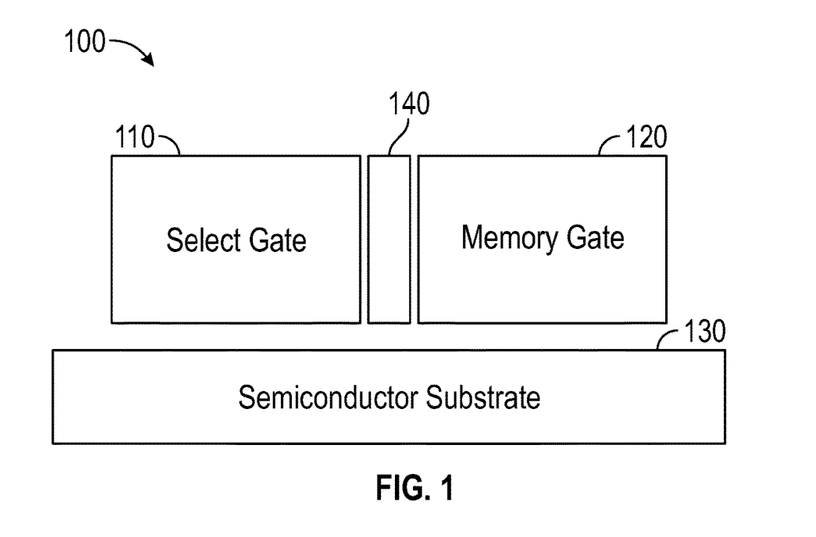
FIG. 1 is a diagram of an example integrated split-gate non-volatile memory cell, according to some aspects of the disclosure.

FIG. 1 is a block diagram of an example split-gate NVM cell 100. As shown in FIG. 1, the split-gate NVM cell 100 may include a select gate 110 and a memory gate 120. The select gate 110 and memory gate 120 are formed on a semiconductor substrate 130. For example, the semiconductor substrate 130 may be silicon wafer or other substrate material. As shown, the select gate 110 and the memory gate 120 are formed on the substrate 130 without forming a recess in the semiconductor. Accordingly, the semiconductor substrate 130 has a substantially planar topography around the areas where the select gate 110 and the memory gate 120 are formed. A dielectric layer 140 may also be formed on the semiconductor substrate 130 to separate the select gate 110 and the memory gate 120. In some implementations, dielectric layer 140 may include multiple layers of dielectric materials.

The split-gate memory cell 100 as described with reference to FIG. 1 may include additional components and features than are shown. The example split-gate memory cell 100 is meant to show particular features of the memory cell to describe the configuration, and additional components may be used within the memory cell or in the periphery of the memory cell to perform operations. For example, the memory cells as described further below are embedded in a semiconductor device with a high-k metal-gate (HKMG) logic FET. The memory cells as described below also include additional details of the MG 110 and SG 120.

When implemented in a semiconductor device, a number of split-gate devices 100 may be formed in a memory array. The memory array may be accessed with control circuitry to address particular memory cells. For example, row decoders and column decoders may be used to address memory cells based on a command received at control circuitry. Furthermore, sense amplifiers and word line or bit line drivers may be used to apply current to an addressed split-gate memory device and sense data stored in a memory gate 110 of the device.

Figure 2:
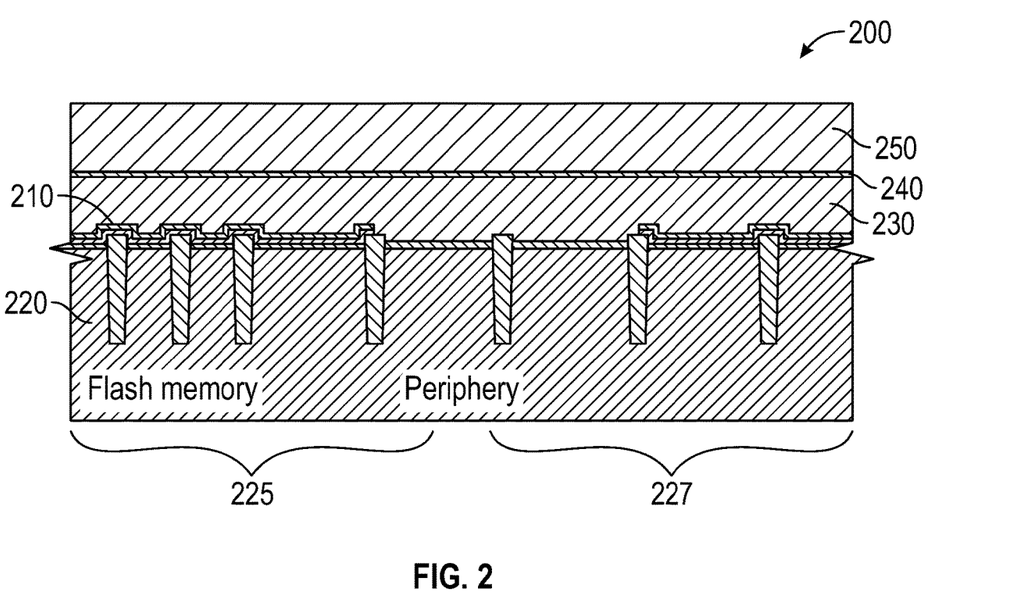
FIG. 2 is an example embedded split-gate NVM device during a portion of fabrication of the device, according to some aspects of the disclosure.

FIG. 2 is a diagram of an example embedded split-gate NVM device 200 during a portion of fabrication of the device. In FIG. 2, the basis of the embedded split-gate NVM device 200 is formed on a semiconductor substrate 220. For example, an oxide-nitride-oxide (ONO) stack 210 may be formed at least in a memory region 225 of the semiconductor substrate 230. In some implementations, the ONO stack 210 may be formed both in the memory region 225 and periphery region or a logic FET region 227, and later removed from the periphery region and the logic FET region. In some implementations, other structures than an oxide-nitride-oxide may be formed on the semiconductor substrate. For example, the oxide-nitride-oxide stack 210 may further be formed with a top and bottom silicon layer in some implementations.

The semiconductor substrate 220 may also include a logic FET region 227 that is separate from the memory region 225. In one embodiment, memory and logic FET regions 225 and 227 may be disposed adjacent to one another. In other embodiments, they may be disposed in different parts of the single semiconductor substrate 220. For example, the logic FET region 227 may be formed later in fabrication to include a high-k metal gate FET or other control circuitry for accessing memory cells in the memory region 225. In some implementations, the logic FET region 227 may also include other components or features in addition to a high-k metal gate FET. In one embodiment, semiconductor substrate 220 may have a relatively flat surface both in the memory region 225 and the logic FET region 227. The substrate 220 surfaces in the memory region and the logic FET region 227 are substantially co-planar, or are within 200 Angstrom of co-planar of one another.

In some implementations a memory gate polysilicon film 230 may be deposited on top of the oxide-nitride-oxide stack 210. As shown, the memory gate polysilicon film 230 may be deposited across the surface of the semiconductor substrate 220 including the logic FET region 227 and the memory region 225. A dielectric film 240 may be deposited on top of the memory gate polysilicon film 230 to act as a cap layer for the memory gate. In some implementations, the dielectric film may be about 20 Angstrom to about 500 Angstrom thick. In some implementations, a second polysilicon film 250 may also be deposited on top of the dielectric film 240 as an additional portion of the cap layer.

Figure 3:
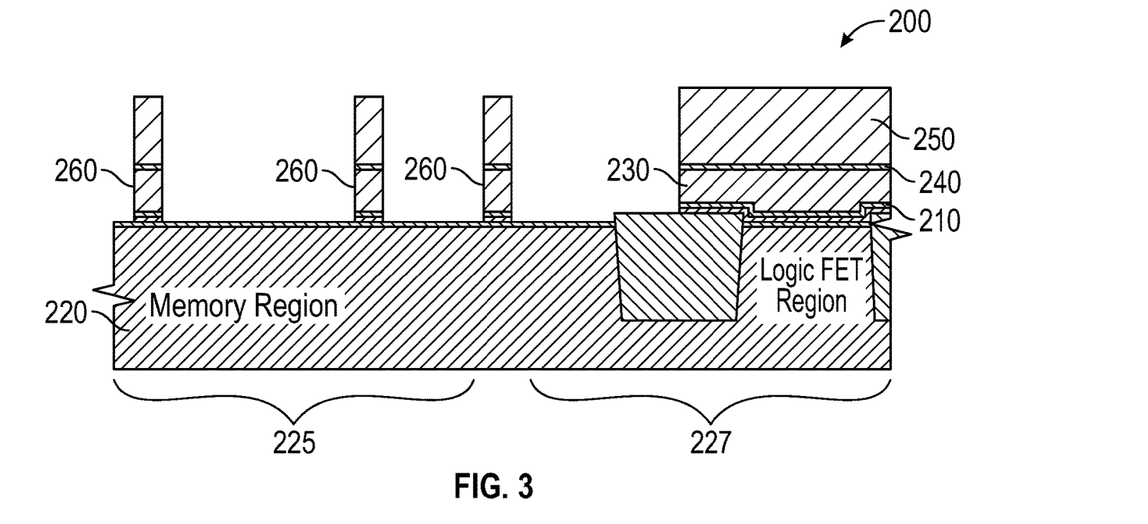
FIG. 3 is an example embedded split-gate NVM device during another portion of fabrication of the device, according to some aspects of the disclosure.

FIG. 3 is a diagram of an example embedded split-gate NVM device 200 during another portion of fabrication of the device. In FIG. 3, the memory gate polysilicon film 230, dielectric film 240 and optional second polysilicon layer 250 have been patterned to the shape of memory gates 260. For example, the device 200 may have had a mask (not shown in FIG. 3) applied to form a pattern using lithography. The mask may protect portions of the memory gate polysilicon film 230 while etching is performed on the device 200. Depending on the implementation, the etching may be a wet etch, a dry etch, or a combination of wet etching and dry etching. The etching process may remove portions of the memory gate polysilicon film 230 that are not protected by the mask. The remaining portions of the memory gate polysilicon film 230 may form the memory gates 260. In some implementations, the memory gates 260 may be formed or patterned on a semiconductor substrate 220 in a different manner than lithography patterning and etching. In one embodiment, the etching process may stop at the bottom oxide layer of the ONO stack 210 in the memory region 225, or another layer.

Figure 4:
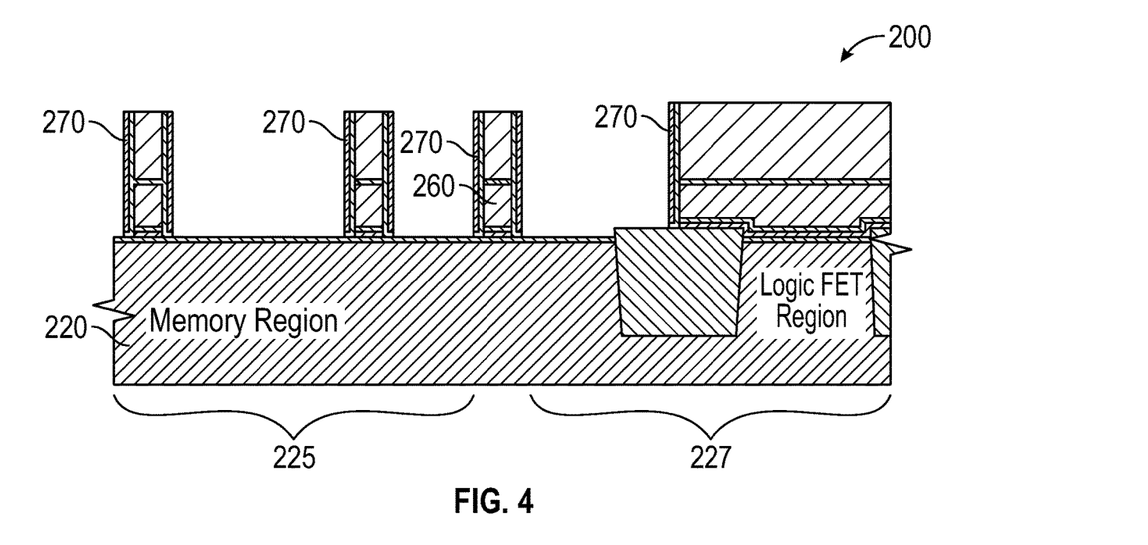
FIG. 4 is an example embedded split-gate NVM device during another portion of fabrication of the device, according to some aspects of the disclosure.

FIG. 4 is a diagram of an example embedded split-gate NVM device 200 during another portion of fabrication of the device. In FIG. 4, a dielectric film 270 is deposited at least on the two lateral sides of the memory gates 260. The dielectric film 270 may eventually be formed as an inter-gate dielectric to separate the memory gates 260 from the later formed select gates in the split-gate memory device 200. In some implementations, the dielectric film 270 may include multiple layers of potentially different dielectric materials. For example, the dielectric film 270 may be formed by multiple deposition or oxidation processes to apply different dielectrics to the sides of the memory gates 260. The dielectric film 270 may also be applied to materials in the logic FET region 270 of the semiconductor substrate 220. In one embodiment, the dielectric film 270 includes at least two dielectric layers.

Figure 5:
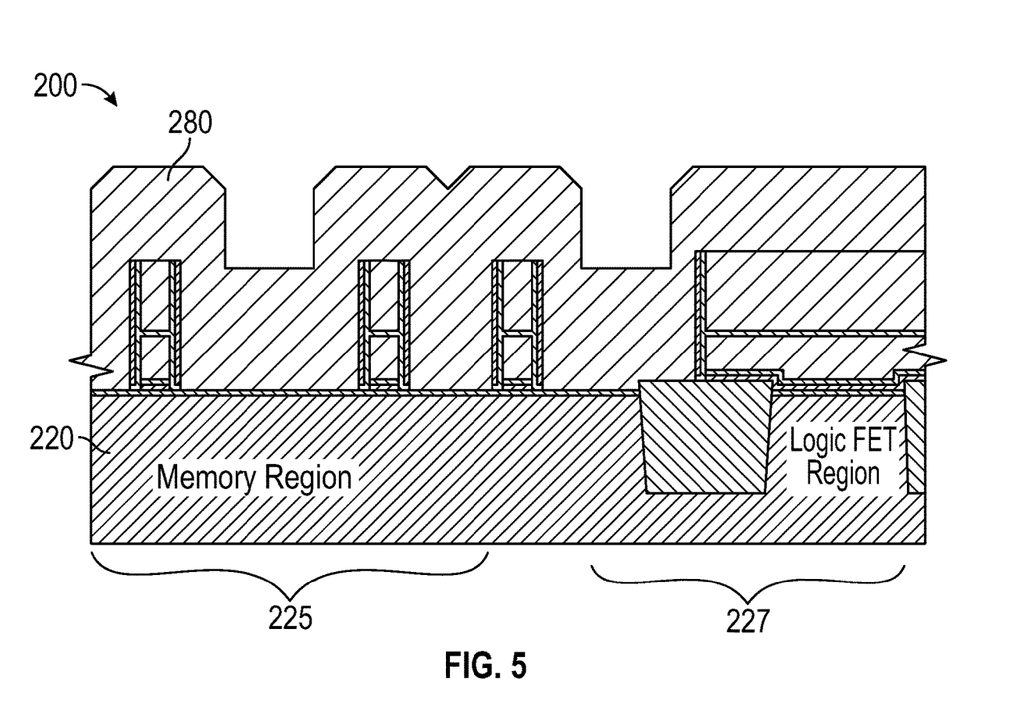
FIG. 5 is an example embedded split-gate NVM device during another portion of fabrication of the device, according to some aspects of the disclosure.

FIG. 5 is a diagram of an example embedded split-gate NVM device 200 during another portion of fabrication of the device. In FIG. 5, a select gate polysilicon film 280 is deposited on the split-gate memory device 200. The select gate polysilicon film 280 may be deposited across the semiconductor substrate 220 including the memory region 225 and the logic FET region 227. In some implementations, the select gate polysilicon film 280 may be similar to the memory gate polysilicon film 250 described above. For example, in some embodiments, the select gate polysilicon film and the memory gate polysilicon film may each be un-doped polysilicon films. In some embodiments, one or both of the memory gate polysilicon film 230 or the select gate polysilicon film 280 may be a doped polysilicon film. In the case that either of the polysilicon films 230 or 280 is deposited un-doped, it may be doped with n-type or p-type dopants at a later stage of processing. In some implementations, the select gate polysilicon film 280 may be doped in a different manner than the memory gate polysilicon film 230 to provide different electrical characteristics. A select gate dielectric may also be formed underneath and before the select gate polysilicon film 280 is deposited.

Figure 6:
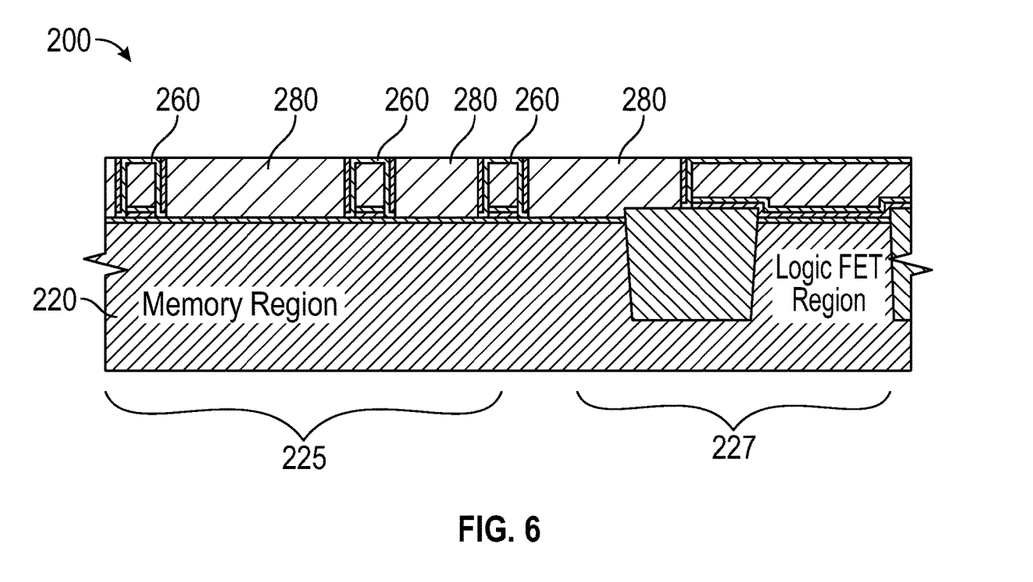
FIG. 6 is an example embedded split-gate NVM device during another portion of fabrication of the device, according to some aspects of the disclosure.
Figure 8:
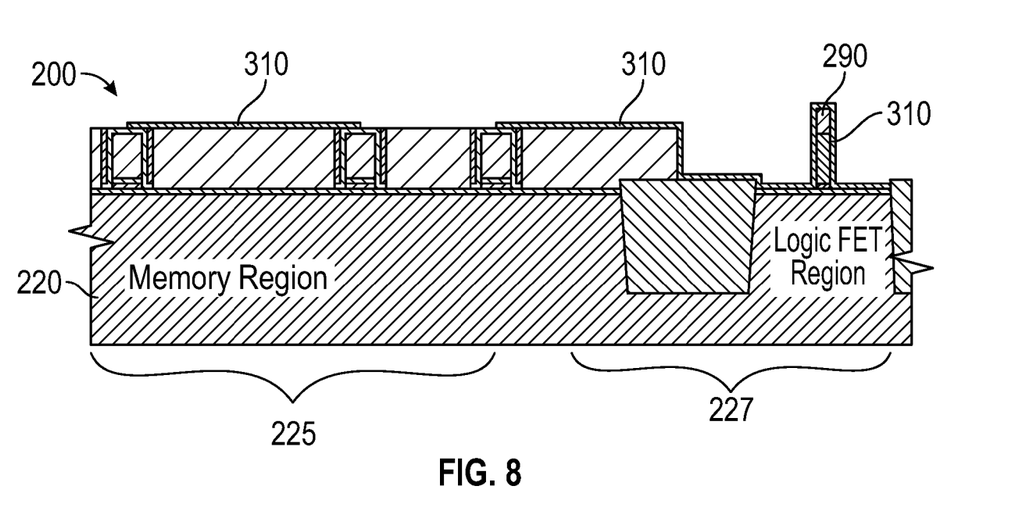
FIG. 8 is an example embedded split-gate NVM device during another portion of fabrication of the device, according to some aspects of the disclosure.

FIG. 6 is a diagram of an example embedded split-gate NVM device 200 during another portion of fabrication of the device. In FIG. 6 portions of the select gate polysilicon film 280 have been removed from the split-gate NVM device 200. For example, portions of the select gate polysilicon film 280 may be removed using a planarizing process. In addition, if the optional second polysilicon layer 250 was applied previously, portions of it may be removed during the planarizing process. In some implementations, a chemical-mechanical planarization (CMP) process may be used to planarize the layers including the select gate polysilicon film 280 and the optional second polysilicon layer 250. For example, in some embodiments, the CMP process may planarize the films to a level of the dielectric film 240. As shown the remaining portions of dielectric film 240 on the memory gate polysilicon film 230 may cause the remaining memory gate 260 to have a slightly lower top surface compared to the select gate polysilicon film 280. In some implementations, other processes may be used to form a flat upper surface as shown in the FIG. 6. Furthermore, as shown in FIG. 8, the process may be applied to both a memory region 225 and a logic FET region 227. After the CMP process, or other planarizing process, the memory gate 260 and the select gate polysilicon film 280 may have upper surfaces that are substantially co-planar, or are within 300 Angstrom of co-planar of one another. In addition, the memory gate stack (memory gate 260 and ONO stack 210) and the select gate stack (select gate polysilicon film 280 and select gate dielectric) may be of substantially similar height, or within 300 Angstrom of difference in height. In one embodiment, neither the memory gate stack nor the select gate stack is formed in a recessed portion of the semiconductor substrate 220.

Figure 7:
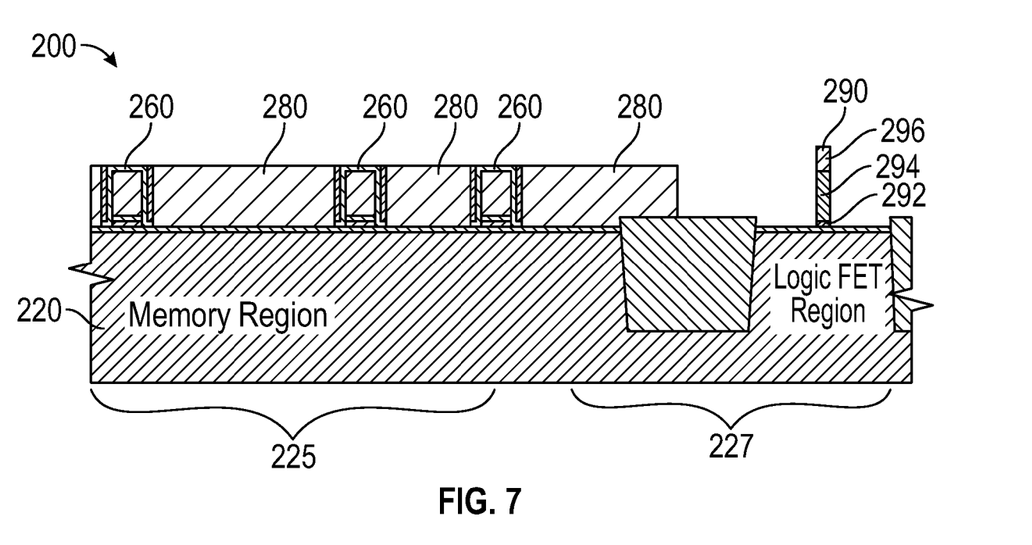
FIG. 7 is an example embedded split-gate NVM device during another portion of fabrication of the device, according to some aspects of the disclosure.

FIG. 7 is a diagram of an example embedded split-gate NVM device 200 during another portion of fabrication of the device. In FIG. 7, formerly formed layers including the memory gate polysilicon film 230 and the select gate polysilicon film 280 have been removed from the logic FET region 227 of the semiconductor substrate 220. In addition, functional portions of an eventual FET device 290 may be formed in the logic FET region 227. For example, a FET gate dielectric 292 and sacrificial polysilicon gate 294 may be formed on the logic FET region 227. In one embodiment, FET gate dielectric 292 may include high-K material including but not limited to Hafnium Dioxide, Zirconium Dioxide, Titanium Dioxide, or the like. Optionally, a gate hardmask 296 may be formed overlying the sacrificial polysilicon gate 294. The FET device 290 may be formed to have a height substantially similar to the height of the select gate stack and the memory gate stack. In some embodiments, after removal of memory gate polysilicon film 230 from the logic FET region 227, a high-K gate dielectric layer (that become gate dielectric 292) and a sacrificial polysilicon layer (that will become sacrificial polysilicon gate 294) may be deposited across the logic FET region 227 of the semiconductor substrate 220. Those layers may then be patterned and etched to provide a basis of FET device 290 that includes a gate dielectric 292 and a sacrificial polysilicon layer 294. In some embodiments, the FET device 290 may be of similar height of the select gate polysilicon layer 280 or memory gate 260. In some embodiments, a gate hardmask 296 may also be deposited and etched on top of the FET device 290.

FIG. 8 is a diagram of an example embedded split-gate NVM device 200 during another portion of fabrication of the device. In FIG. 8, a dielectric film 310 is deposited over portions of the memory region 225 and the logic FET region 227. The dielectric film 310 may be $SiO_2$, SiN, SiRN, SiON, or the like. The dielectric layer 310 may act as a hardmask for additional etching processes described below. In some implementations, the dielectric layer 310 may form part of the logic FET 290, for example the eventual spacer of logic FET 290. Furthermore, as shown in FIG. 8, the dielectric layer 310 may be patterned to only cover portions of the split-gate memory device 200 using lithography and etching.

Figure 9:
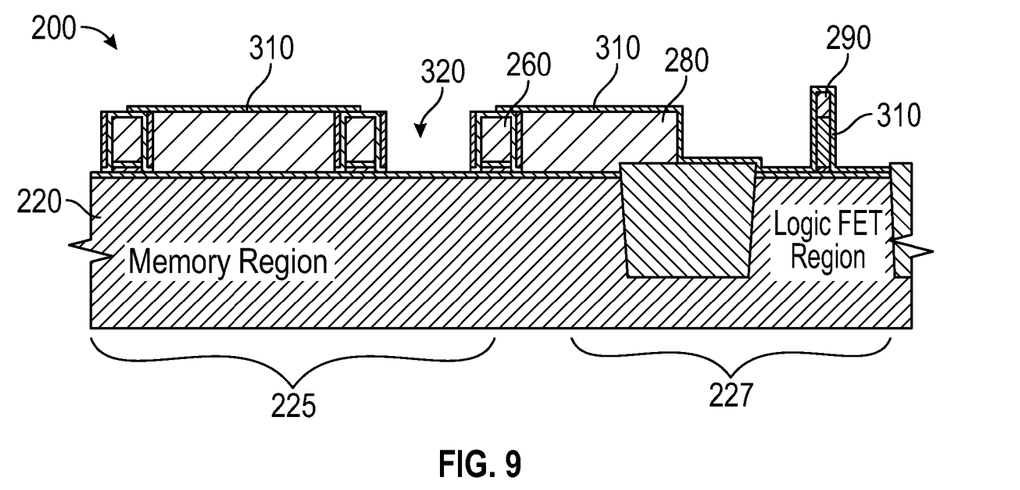
FIG. 9 is an example embedded split-gate NVM device during another portion of fabrication of the device, according to some aspects of the disclosure.

FIG. 9 is a diagram of an example embedded split-gate NVM device 200 during another portion of fabrication of the device. In FIG. 9, etching has been performed to remove portions of the select gate polysilicon film 280 on one lateral side of memory gate 260, such as the source side of split-gate memory cell. In various embodiments described herein, the etching may be a wet etching, a dry etching process, or a combination thereof. For example, after the etching process, region 320 may be open to separate different memory gates 260. In some implementations, the region 320 may be opened using different processes than etching. The etching may remove portions of the select gate polysilicon film 280 at source regions of the split-gate memory devices. In one embodiment, a wet etch may be used to achieve high etch selectivity between the select gate polysilicon film 280 and various dielectric films (for example, dielectric film 310). In some implementations, Tetramethylammonium hydroxide (TMAH) may be used as an exemplary wet etch chemical. The memory gate 260 and the logic FET 290 may be encapsulated by dielectric material 310 as shown in FIG. 9 to protect portions of select gate polysilicon film 280, logic FET 290 and the memory gate 260 during the etching process.

Figure 10:
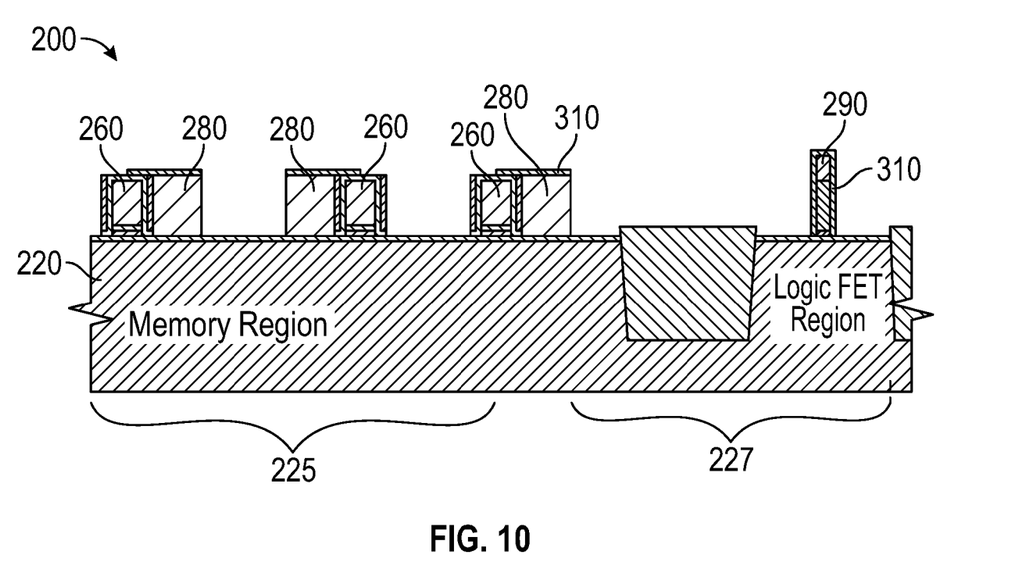
FIG. 10 is an example embedded split-gate NVM device during another portion of fabrication of the device, according to some aspects of the disclosure.

FIG. 10 is a diagram of an example embedded split-gate NVM device 200 during another portion of fabrication of the device. In FIG. 10, etching has been performed to pattern portions of the select gate polysilicon film 280 on another lateral side of memory gate 260, such as the drain side of the split-gate memory cell. As described above, in various embodiments, the etching may be dry etching or wet etching and may be performed in different orders than described. The etching may remove additional portions of the select gate polysilicon film 280 to form patterned select gates 280 as shown in FIG. 10. In one embodiment, the removing of select gate polysilicon film 280, as described in FIG. 9, and the patterning of select gate polysilicon film 280 to form select gate 280, as described in FIG. 10, may be performed concurrently. In another embodiment, they may be performed individually. Although shown having a memory array having common source lines to be formed between adjacent memory gates 260, in some embodiments, a split-gate memory arrays may be formed with memory cells having select gates 280 on either sides of memory gates 260 throughout. In such cases, the formation of memory gates 260 and select gates 280 may be formed using the techniques described herein, but with different patterning of dielectric film 310 for particular polysilicon layers.

Figure 11:
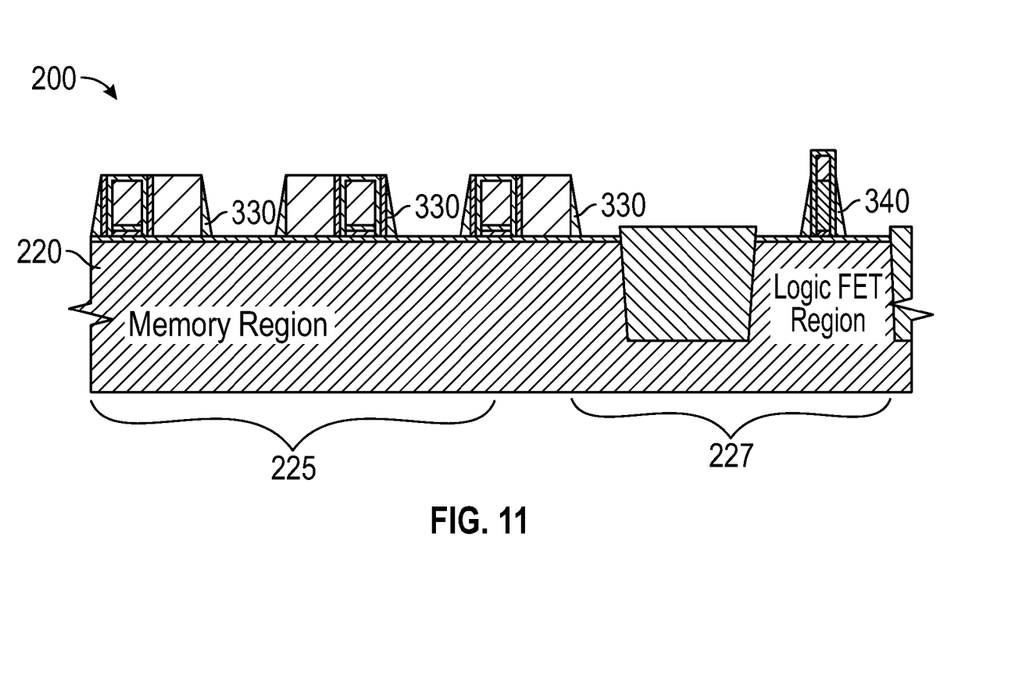
FIG. 11 is an example embedded split-gate NVM device during another portion of fabrication of the device, according to some aspects of the disclosure.

FIG. 11 is a diagram of an example embedded split-gate NVM device 200 during another portion of fabrication of the device. Logic FET spacers 340 and split-gate source or drain spacers 330 are formed on the semiconductor substrate 220. Logic FET spacers 340 and split-gate source or drain spacers 330 may be formed concurrently or individually. In one embodiment, source and drain implants (not shown in this figure), such as lightly doped drain (LDD) or source/drain implants, may be formed in substrate 220 besides or underneath logic FET spacers 340 and split-gate source or drain spacers 330.

Figure 12:
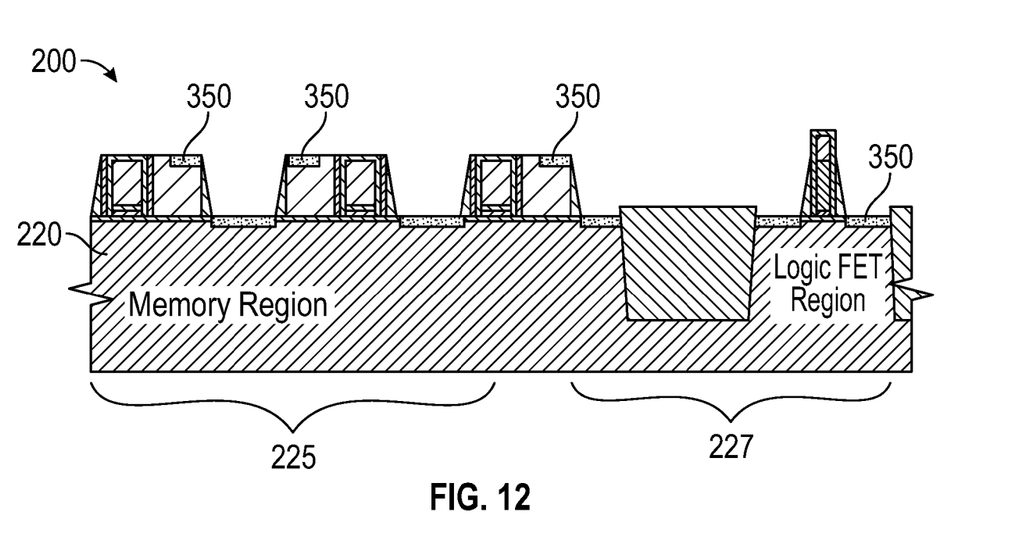
FIG. 12 is an example embedded split-gate NVM device during another portion of fabrication of the device, according to some aspects of the disclosure.

FIG. 12 is a diagram of an example embedded split-gate NVM device 200 during another portion of fabrication of the device. In FIG. 12, silicide 350 is formed overlaying source and drain regions of logic FET 290 and split-gate memory devices. In one embodiment, silicide 350 is formed on an upper surface of select gates 280. In some implementations, the silicide 350 may be formed on an upper surface of the memory gates 260 instead of or in addition to being formed on the select gates 280. Furthermore, silicide formation may be prevented in regions between the select gates 280 and the memory gates 260 by a dielectric film.

Figure 13:
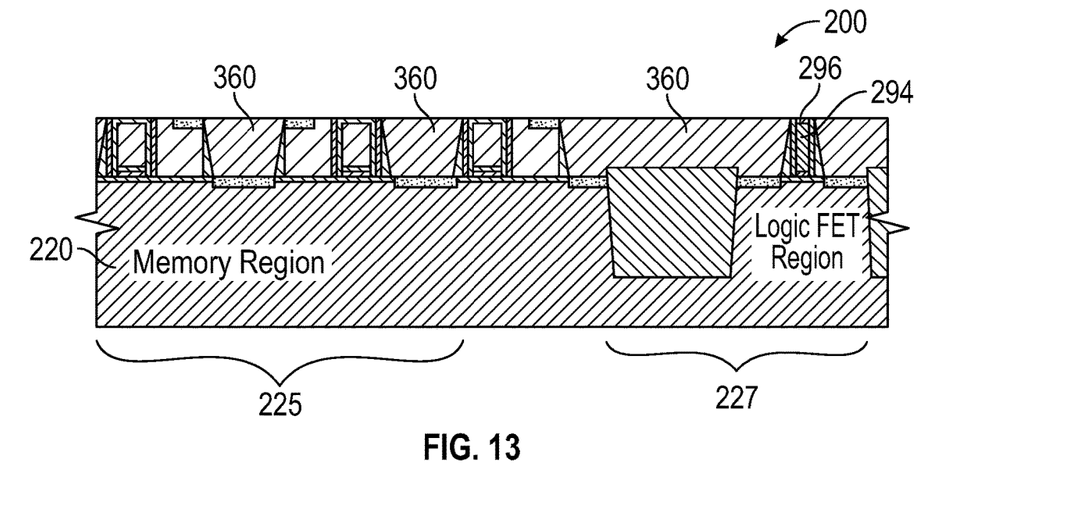
FIG. 13 is an example embedded split-gate NVM device during another portion of fabrication of the device, according to some aspects of the disclosure.

FIG. 13 is a diagram of an example embedded split-gate NVM device 200 during another portion of fabrication of the device. In FIG. 13 an interlayer dielectric (ILD) has been deposited over and around the select gates 280, memory gates 260, and logic FET 290. In some embodiments, the ILD layer may be an oxide layer, or it may be a different form of dielectric. The ILD layer 360 may subsequently be planarized to provide a level upper surface between the select gates 280, memory gates 260, and the logic FET 290. In some embodiments, a CMP process may stop when FET hardmask 296 of the logic FET device 290 is exposed. The CMP process may also proceed to expose the sacrificial polysilicon gate 294 of the logic FET device 290 instead. In one embodiment, the CMP process of the ILD layer 360 may configure the upper surfaces of memory gate 260, select gate 280, and logic FET 290 to be substantially co-planar, or within 300 Angstrom of co-planar.

Figure 14:
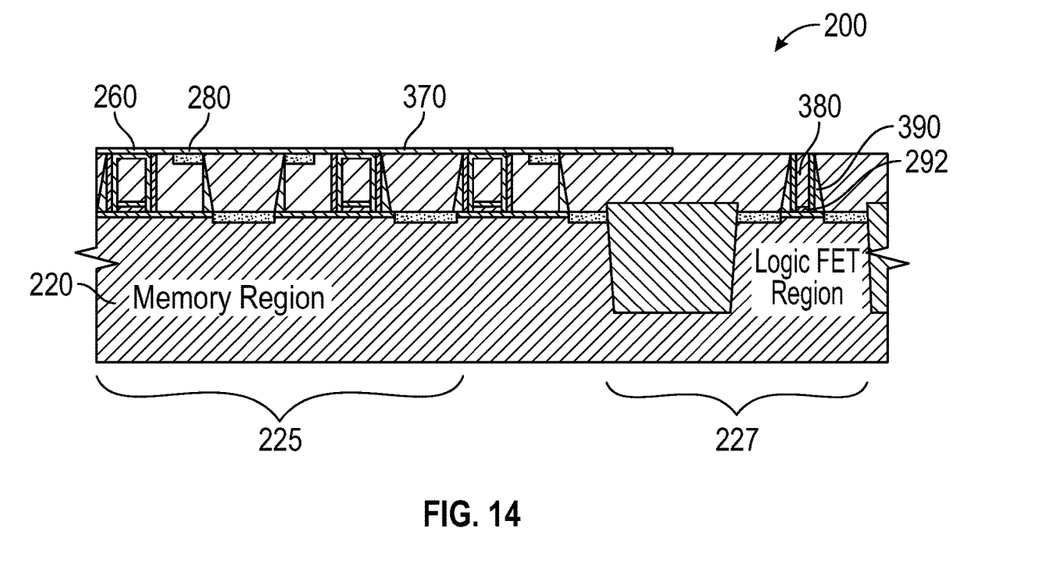
FIG. 14 is an example embedded split-gate NVM device during another portion of fabrication of the device, according to some aspects of the disclosure.

FIG. 14 is a diagram of an example embedded split-gate NVM device 200 during another portion of fabrication of the device. In FIG. 14, a protective mask 370 has been applied to memory region 225 of the split-gate NVM device 200. In one embodiment, the protective mask 370 may include but not limited to, silicon oxide, silicon nitride, or silicon carbon nitride. The protective mask 370 may protect the split-gate memory cells including memory gates 260 and select gates 280. The logic FET region 227 may not be covered by the protective mask 370. For example, the protective mask 370 may be removed from the logic FET region 227. After masking the memory region 225 of the substrate 220, an etching (dry etching or wet etching) process may be performed to remove the sacrificial polysilicon gate 294 (and any hardmask 296 remaining on the sacrificial polysilicon gate 294). A metal gate material 380 may then be deposited overlying FET gate dielectric 292 in the logic FET region 227 to replace the sacrificial polysilicon gate 294 that was previously forming the gate of the FET device 290. After deposition of the metal gate material 380, the split-gate memory device 200 may be complete with select gates 280 and memory gates 260 forming a split-gate memory cell integrated with the high-k metal gate (HKMG) logic FET 390. In one embodiment, metal gate material 380 may include but not limited to tungsten, aluminum, TiN, TiAl, or other metal metals, alloys, or composites. After metal gate material 380 is formed, optionally, a metal polish process may be performed to planarize an upper surface of the HKMG logic FET 390.

Figure 15:
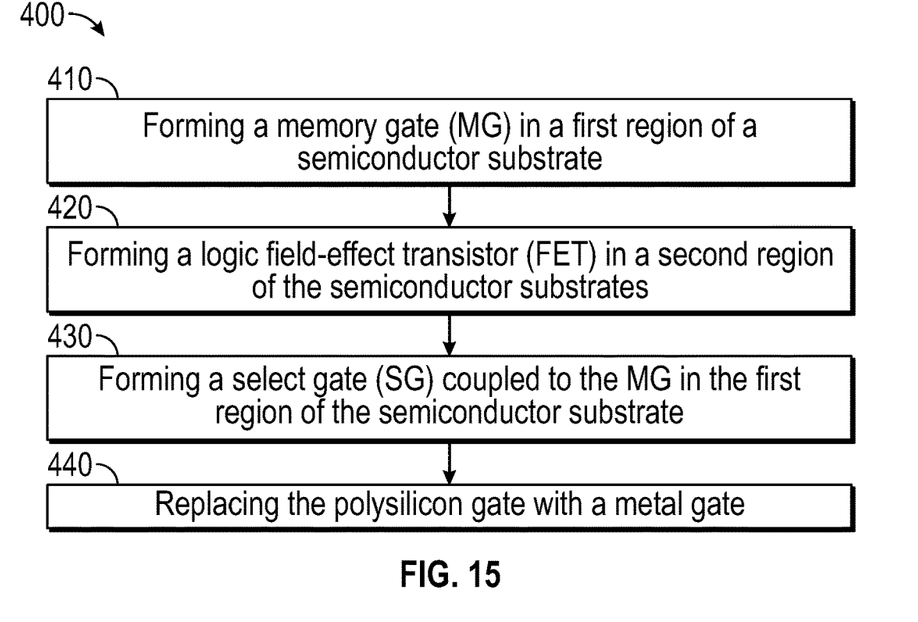
FIG. 15 is a flow chart showing an example method for fabricating a split-gate NVM device, according to some aspects of the disclosure.

FIG. 15 is a flow chart showing an example method 400 for fabricating a split-gate NVM device as described above. For example, the method 400 may be implemented to fabricate split-gate memory device 200 as shown in FIGS. 2-14 and described above.

Beginning in block 410, a memory gate may be formed in a first region of a semiconductor substrate. For example, a memory gate may be formed as described with reference to FIGS. 2-4 above by depositing a polysilicon film and removing portions of the film using lithography and etching. In some implementations, the memory gate may be formed in a different manner.

In block 420, a logic field-effect transistor is formed in a second (logic FET) region of the semiconductor substrates. The logic FET may have a high-K dielectric and is formed temporarily with a polysilicon gate. For example, the logic FET may be formed as described with reference to FIG. 7 above.

In block 430, a select gate is formed adjacent to the memory gate in the first (memory) region of the semiconductor substrate. For example, the select gate may be formed by depositing a polysilicon film, etching back the polysilicon film such that the memory gate and select gate are substantially coplanar, and patterning the film to remove portions of the select gate. In some implementations, the select gate may be formed as describe above with respect to FIGS. 5-10.

In block 440 the polysilicon gate of the logic FET is replaced with a metal gate. After replacing the metal gate, devices formed in the memory region and in the logic FET region may be substantially co-planar. The height at which they are coplanar after a CMP process may expose either a hardmask on the sacrificial polysilicon gate or the sacrificial polysilicon gate itself. The sacrificial polysilicon gate may then be etched away with either a wet etching or dry etching process after patterning of a protective layer to protect the memory region. The metal gate may then be formed where the sacrificial polysilicon gate was removed. In some implementations, the metal may replace the polysilicon gate as described with reference to FIG. 14 above.

Figure 16:
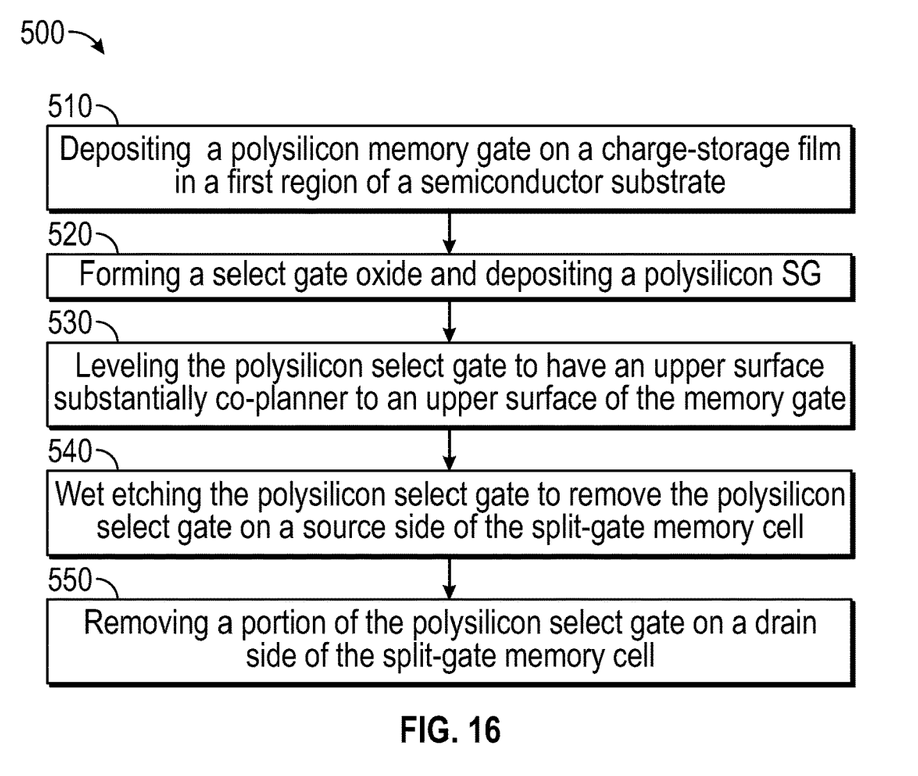
FIG. 16 is a flow chart showing an example method for fabricating a split-gate NVM device, according to some aspects of the disclosure.

FIG. 16 is a flow chart showing an example method for fabricating a split-gate NVM device as described above. For example, the method 400 may be implemented to fabricate split-gate memory device 200 as shown in FIGS. 2-10 and described above. Beginning in block 510, a polysilicon memory gate layer may be deposited on a semiconductor substrate on top of a charge-storage film in a first region of the semiconductor substrate. The polysilicon memory gate layer is then patterned and etched to form a memory gate. For example, the memory gate may be deposited and formed as described with reference to FIGS. 2-4 above.

In block 520 a select gate oxide may be formed underneath a polysilicon select gate layer. For example, the polysilicon select gate layer may be deposited as described above with reference to FIG. 5. In some implementations, a select gate may be formed with other components or features than as shown in the figures.

In block 530, the polysilicon select gate layer may be leveled such that top surface of the polysilicon select gate layer is substantially coplanar with the top surface of the memory gate. For example, the polysilicon select gate layer may be leveled using a CMP process, or another process for developing a consistent plane on the surface of the device. In some implementations, the leveling or planarizing may be performed as described with reference to FIG. 6 above.

In block 540, the planarized/leveled polysilicon select gate layer may be etched to remove portions of the polysilicon select gate layer disposed between two memory gates, for example on a source side of the split-gate memory cell. In some implementations, Tetramethylammonium hydroxide (TMAH) may be used as an exemplary wet etch chemical. For example, the wet etching or dry etching may be performed as discussed above with reference to FIG. 9.

In block 550, additional portions of the polysilicon select gate layer may be removed to form the select gate. In one embodiment, the select gate may be formed adjacent to the memory gate on a drain side of the split-gate memory cell. For example, a polysilicon select gate layer may be removed with a lithography and etching process, such as dry etching or wet etching processes. In some implementations, the polysilicon select gate film may be removed as described with reference to FIG. 10 above.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and or alternating manner. The terms "first," "second," "third," "fourth," etc. as used herein are meant as labels to distinguish among different elements and may not necessarily have an ordinal meaning according to their numerical designation. As used herein, the term "coupled" may mean connected directly or indirectly through one or more intervening components. Any of the signals provided over various buses described herein may be time multiplexed with other signals and provided over one or more common on-die buses. Additionally, the interconnection and interfaces between circuit components or blocks may be shown as buses or as single signal lines. Each of the buses may alternatively be one or more single signal lines and each of the single signal lines may alternatively be buses.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of the claimed subject matter include, but are not limited to, various operations described herein. These operations may be performed by hardware components, software, firmware, or a combination thereof.

The above description sets forth numerous specific details such as examples of specific systems, components, methods, and so forth, in order to provide an understanding of several embodiments of the claimed subject matter. It may be apparent to one skilled in the art, however, that at least some embodiments of the may be practiced without these specific details. In other instances, well-known components or methods are not described in detail or are presented in simple block diagram format. Thus, the specific details set forth are merely exemplary. Particular implementations may vary from these exemplary details and still be contemplated to be within the scope of the claimed subject matter.

What is claimed is:

1. A method, comprising:
    forming a memory gate (MG) polysilicon layer in first and second regions;
    patterning the MG polysilicon layer in the first region to form a MG stack;
    depositing a select gate (SG) polysilicon layer in the first region and the second region;
    concurrently removing at least the SG polysilicon layer completely in the second region and above a top surface of the MG stack in the first region;
    after removing at least the SG polysilicon layer, removing the MG polysilicon layer in the second region;
    forming a sacrificial polysilicon gate on a high-k dielectric in the second region, wherein the first and second regions are disposed in a single semiconductor substrate;
    forming a select gate (SG) stack adjacent to the MG stack in the first region of the semiconductor substrate; and
    replacing the sacrificial polysilicon gate with a metal gate to form a logic field effect transistor (FET) in the second region, and
    wherein surfaces of the substrate in the first region and the second region are substantially co-planar.

2. The method of claim 1, wherein forming the MG stack comprises:
    forming a charge trapping layer in the first region of the semiconductor substrate;
    forming a MG polysilicon layer over the charge trapping layer; and
    patterning at least the MG polysilicon layer to form a memory gate (MG).

3. The method of claim 2, wherein forming the SG stack comprises:
    forming a gate oxide layer underneath the SG polysilicon layer in the first region of the semiconductor substrate;
    depositing an SG polysilicon layer over the gate oxide layer; and
    patterning at least the SG polysilicon layer remaining in the first region to form a select gate (SG) such that the SG stack is disposed adjacent to the MG stack.

4. The method of claim 1, further comprising forming at least two dielectric layers between the MG stack and the SG stack.

5. The method of claim 1 further comprising forming a silicide on at least one of the MG or the SG.

6. The method of claim 3, wherein forming the SG stack further comprises:
planarizing the SG polysilicon layer, wherein the planarizing stops at a thin dielectric layer overlying the MG stack such that the MG and SG stacks have an approximately same height.

7. The method of claim 6, wherein the thin dielectric layer has a thickness in an approximate range of 20 angstrom to 500 angstrom.

8. The method of claim 1, wherein a first surface of the first region and a second surface of the second region of the substrate are within 200 angstrom of co-planar of one another.

9. The method of claim 1, wherein a first upper surface of the SG, a second upper surface of the MG, and a third upper surface of the logic FET are within 300 angstroms of co-planar of one another.

10. The method of claim 1, prior to replacing the sacrificial polysilicon gate with the metal gate, further including comprising:
forming a protection film overlying at least the SG and MG stacks in the first region.

11. A method of fabricating a semiconductor device, comprising:
forming a split-gate memory cell in a first region of a substrate, further comprising;
depositing a memory gate (MG) polysilicon layer overlying a charge trapping layer in the first region and a second region;
patterning at least the MG polysilicon layer to form an MG in the first region;
depositing a select gate (SG) polysilicon layer overlying an SG oxide layer and the MG in the first region and the second region;
planarizing the SG polysilicon layer such that top surfaces of the MG and SG polysilicon layer are substantially coplanar and parallel to a surface of the substrate in the first region, wherein planarizing the SG polysilicon layer concurrently removes the SG polysilicon layer completely in the second region; and
removing portions of the SG polysilicon layer and SG oxide layer in the first region to form an SG adjacent to the MG, and the SG polysilicon layer completely in the second region;
after planarizing the SG polysilicon layer, removing the MG polysilicon layer in the second region; and
forming a logic field-effect transistor (FET) including comprising a metal gate disposed over a high-K dielectric in the second region of the substrate, wherein the logic FET and the split-gate memory cell have a substantial same height.

12. The method of claim 11, further comprising:
depositing a thin dielectric layer overlying the MG polysilicon layer, wherein planarizing the SG polysilicon layer stops at the thin dielectric layer.

13. The method of claim 11, wherein removing portions of the SG polysilicon layer includes:
removing a first portion of the SG polysilicon layer on one side of the MG; and
patterning a second portion of the SG polysilicon layer on another side of the MG to form the SG.

14. The method of claim 13, wherein removing the first portion of the SG polysilicon layer includes performing at least one of wet etch or dry etch.

15. The method of claim 11, further comprising forming at least two dielectric layers overlying at least two side surfaces of the MG prior to depositing the select gate (SG) polysilicon layer.

16. The method of claim 11, wherein a first upper surface of the SG, a second upper surface of the MG, and a third upper surface of the logic FET are within 300 angstroms of co-planar of one another.

17. The method of claim 11, further comprising depositing a cap layer overlying the MG polysilicon layer, wherein depositing the cap layer further comprises depositing one or more of a dielectric film, an amorphous silicon film, or a polysilicon film.

18. A method to fabricate a semiconductor device, comprising:
depositing a memory gate (MG) polysilicon layer overlying a charge trapping layer in first and second regions of a substrate;
patterning at least the MG polysilicon layer to form an MG in the first region;
depositing a select gate (SG) polysilicon layer overlying an SG oxide layer and the MG in the first region and the second region;
planarizing the SG polysilicon layer such that top surfaces of the MG and the SG polysilicon layer are substantially co-planar in the first region;
removing the SG polysilicon layer completely in the second region concurrently with planarizing the SG polysilicon layer in the first region;
after removing the SG polysilicon layer, removing the MG polysilicon layer in the second region;
depositing a high-k dielectric layer over the substrate in the second region, and a sacrificial polysilicon gate layer overlying the high-k dielectric layer;
patterning the sacrificial polysilicon gate layer and the high-k dielectric layer;
removing portions of the SG polysilicon layer to form an SG adjacent to the MG;
depositing an inter-layer dielectric (ILD) to encapsulate the MG, the SG, and a logic field-effect transistor (FET);
planarizing the ILD;
removing the sacrificial polysilicon gate layer; and
depositing a metal gate overlying the high-K dielectric layer to form the logic FET field-effect transistor (FET) in the second region.

19. The method of claim 18, further comprising:
depositing a cap layer overlying the MG polysilicon layer, wherein the cap layer includes at least one layer of dielectric material, polysilicon, or a combination thereof.

20. The method of claim 18, further comprising:
forming inter-gate dielectric layers, each including comprising at least two dielectric layers, overlying at least two side walls of the MG.

21. The method of claim 18, wherein planarizing the SG polysilicon layer comprises includes performing a chemical mechanical planarization (CMP) process, a dry etch-back process, or a combination thereof.

22. The method of claim 18, further comprising:
performing metal polish such that top surfaces of the MG, the SG and the logic FET are substantially co-planar.

23. The method of claim 18, wherein depositing the MG polysilicon layer comprises includes performing one of:
depositing a doped polysilicon layer; or
depositing an undoped polysilicon layer and subsequently doping the undoped polysilicon layer.

24. The method of claim 18, wherein depositing the SG polysilicon layer comprises includes performing one of:
   depositing a doped polysilicon layer; or
   depositing an undoped polysilicon layer and subsequently doping the undoped polysilicon layer.

25. The method of claim 18, wherein prior to removing the sacrificial polysilicon gate layer, the method further including comprising:
   forming a protection film overlying at least the MG and the SG.

* * * * *